(12) United States Patent
Saulnier et al.

(10) Patent No.: US 10,832,945 B2
(45) Date of Patent: Nov. 10, 2020

(54) TECHNIQUES TO IMPROVE CRITICAL DIMENSION WIDTH AND DEPTH UNIFORMITY BETWEEN FEATURES WITH DIFFERENT LAYOUT DENSITIES

(71) Applicant: International Business Machines Corporation, Armonk, NY (US)

(72) Inventors: Nicole Saulnier, Slingerlands, NY (US); Indira Seshadri, Niskayuna, NY (US); Lawrence A. Clevenger, Saratoga Springs, NY (US); Leigh Anne H. Clevenger, Rhinebeck, NY (US); Gauri Karve, Cohoes, NY (US); Fee Li Lie, Albany, NY (US); Isabel Cristina Chu, Melrose, NY (US); Hosadurga Shobha, Niskayuna, NY (US); Ekmini A. De Silva, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/277,528

(22) Filed: Feb. 15, 2019

(65) Prior Publication Data

US 2020/0266100 A1 Aug. 20, 2020

(51) Int. Cl.
*H01L 21/768* (2006.01)
*H01L 21/311* (2006.01)

(52) U.S. Cl.
CPC .. *H01L 21/76808* (2013.01); *H01L 21/31116* (2013.01); *H01L 21/31144* (2013.01); *H01L 21/76804* (2013.01); *H01L 21/76805* (2013.01)

(58) Field of Classification Search
CPC ......... H01L 21/76808; H01L 21/31116; H01L 21/31144; H01L 21/76804; H01L 21/76805
See application file for complete search history.

(56) References Cited

U.S. PATENT DOCUMENTS 6,495,469 B1 12/2002 Yang et al.
7,030,031 B2 4/2006 Wille et al.
(Continued)

OTHER PUBLICATIONS

Lee et al., "Feature-Size Dependence of Etch Rate in Reactive Ion Etching," J. Electrochem. Soc., vol. 138, No. 8, Aug. 1991, pp. 2439-2445.
(Continued)

*Primary Examiner* — Joseph M Galvin, III
(74) *Attorney, Agent, or Firm* — James Nock; Michael J. Chang, LLC

(57) ABSTRACT

Techniques to improve CD width and depth uniformity between features with different layout densities are provided. In one aspect, a method of forming a contact structure includes: patterning features in different regions of a dielectric at different layout densities whereby, due to etch loading effects, the features are patterned to different depths in the dielectric and have different bottom dimensions; depositing a sacrificial spacer into/lining the features whereby some of the features are pinched-off by the sacrificial spacer; opening up the sacrificial spacer at bottoms of one or more of the features that are not pinched-off by the sacrificial spacer; selectively extending the one or more features in the dielectric, such that the one or more features have a discontinuous taper with a stepped sidewall profile; removing the sacrificial spacer; and filling the features with a conductive material to form the contact structure. A contact structure is also provided.

15 Claims, 6 Drawing Sheets

(56) References Cited

U.S. PATENT DOCUMENTS

| | | |
|---|---|---|
| 7,232,748 B2 | 6/2007 | Ali |
| 7,602,066 B2 | 10/2009 | Brakensiek et al. |
| 7,687,303 B1 | 3/2010 | Sukharev et al. |
| 9,653,345 B1 * | 5/2017 | Chou .................... H01L 21/308 |
| 2006/0195218 A1 | 8/2006 | Yamashita et al. |
| 2008/0102638 A1 | 5/2008 | Naik et al. |
| 2011/0039413 A1 | 2/2011 | Akinmade-Yusuff et al. |
| 2012/0309189 A1 * | 12/2012 | Park .................. H01L 21/76877 |
| | | 438/643 |
| 2015/0140753 A1 * | 5/2015 | Simsek-Ege ...... H01L 21/32139 |
| | | 438/268 |

OTHER PUBLICATIONS

Chen et al., "90-nm dual damascene patterning with a new via fill material." In Advanced Microlithography Technologies, vol. 5645, pp. 339-352. International Society for Optics and Photonics, Jan. 2005.

Sukharev et al., "Design specific variation in pattern transfer by via/contact etch process: full-chip analysis," Proc. SPIE Symposium, vol. 7275, pp. 7275OH-1 to 7275OH-12 (Mar. 2009).

\* cited by examiner

Feature A - iso

Feature B – semi iso

Feature C – dense

Feature A - iso

Feature B – semi iso

Feature C – dense

Feature A - iso

Feature B – semi iso

Feature C – dense

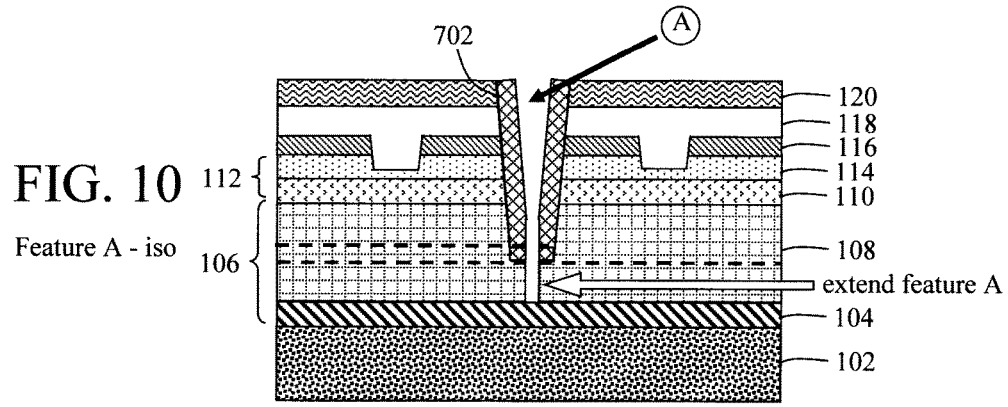
FIG. 10 Feature A - iso
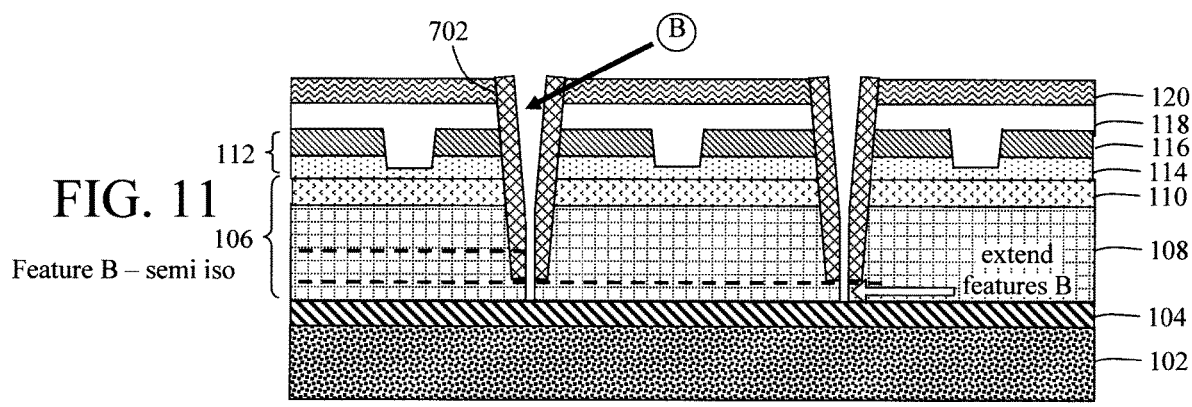
FIG. 11 Feature B – semi iso
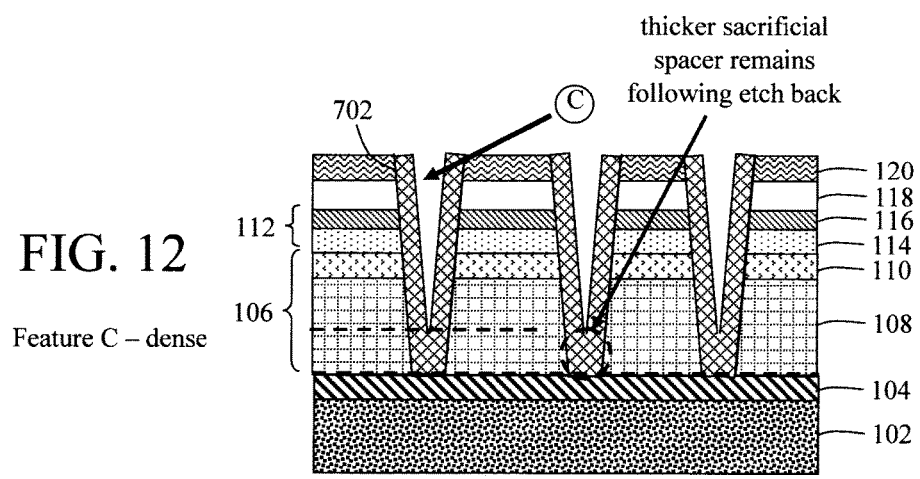
FIG. 12 Feature C – dense Feature A - iso 1302 Taper through portion of dielectric
Step
Narrow profile Feature B – semi iso 1402 Taper through portion of dielectric
Step
Narrow profile Feature C – dense

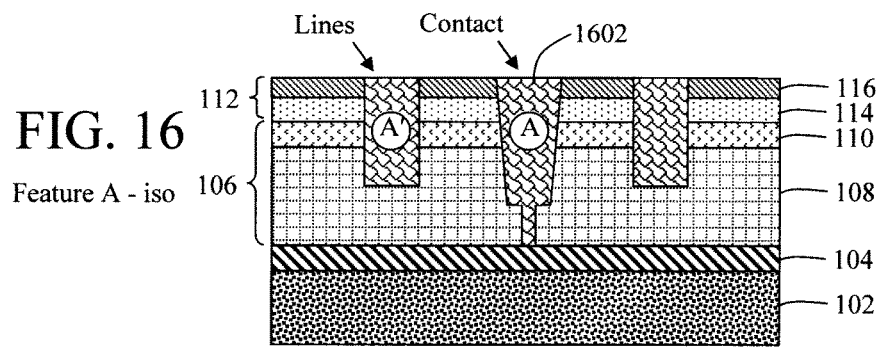
FIG. 16 Feature A - iso
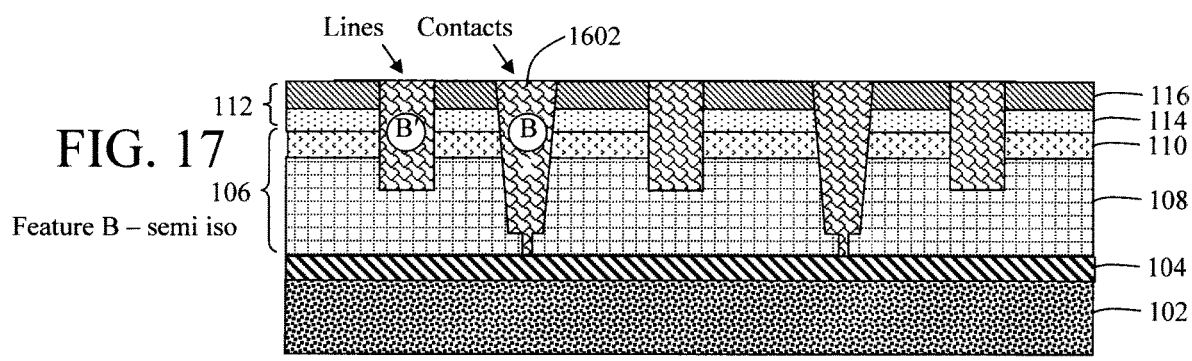
FIG. 17 Feature B – semi iso
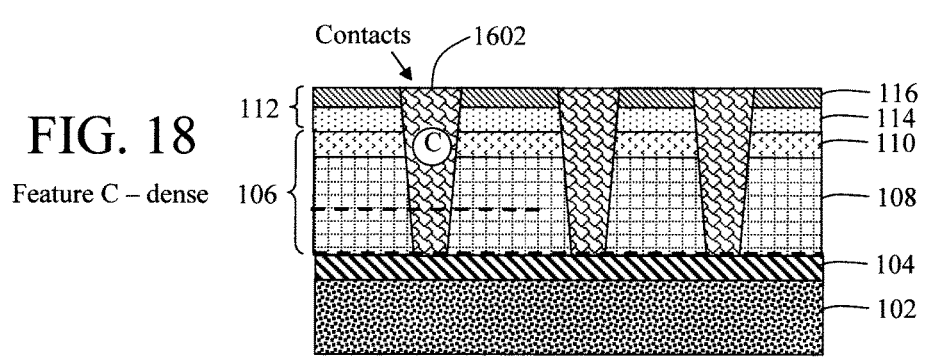
FIG. 18 Feature C – dense

TECHNIQUES TO IMPROVE CRITICAL DIMENSION WIDTH AND DEPTH UNIFORMITY BETWEEN FEATURES WITH DIFFERENT LAYOUT DENSITIES

FIELD OF THE INVENTION

The present invention relates to patterning features in the back-end-of-line (BEOL), and more particularly, to techniques to improve critical dimension (CD) width and depth uniformity between features with different layout densities.

BACKGROUND OF THE INVENTION

In the back-end-of-line (BEOL), features such as vias are typically patterned in a dielectric using a directional etching process such as reactive ion etching (RIE). The depth of the vias is based on the etch time, layout density, etc. The vias with different pattern density etch at different rates due to the effects of factors such as RIE lag and etch loading effects. RIE lag is the slowing of the average etch rate inside a trench as the width of the trench changes. See, for example, Lee et al., "Feature-Size Dependence of Etch Rate in Reactive Ion Etching," J. Electrochem. Soc., vol. 138, no. 8, August 1991, pp. 2439-2445. Etch loading effects refer to the etch rate dependence on a quantity of material being removed. With iso-dense loading, etch loading effects can undesirably lead to etch non-uniformity across a chip. As a result, vias of varying depths are often formed, with unopened vias being present for certain features.

Therefore, techniques for forming features with improved width/depth uniformity between features with different layout densities would be desirable.

SUMMARY OF THE INVENTION

The present invention provides techniques to improve critical dimension (CD) width and depth uniformity between features with different layout densities. In one aspect of the invention, a method of forming a contact structure is provided. The method includes: patterning features in at least two different regions of a dielectric at different layout densities whereby, due to etch loading effects, the features are patterned to different depths in the dielectric and have different bottom dimensions; depositing a sacrificial spacer into and lining the features whereby, due to the features having the different bottom dimensions, some of the features are pinched-off by the sacrificial spacer; opening up the sacrificial spacer at bottoms of one or more of the features that are not pinched-off by the sacrificial spacer; selectively extending the one or more features in the dielectric, such that the one or more features have a discontinuous taper with a stepped sidewall profile; removing the sacrificial spacer; and filling the features with a conductive material to form the contact structure.

In another aspect of the invention, a contact structure is provided. The contact structure includes: features patterned in at least two different regions of a dielectric at different layout densities, wherein one or more of the features have a discontinuous taper with a stepped sidewall profile; and a conductive material disposed in the features.

A more complete understanding of the present invention, as well as further features and advantages of the present invention, will be obtained by reference to the following detailed description and drawings.

BRIEF DESCRIPTION OF THE DRAWINGS

FIG. 10 is a cross-sectional diagram illustrating an etch back having been performed to open up the sacrificial spacer at the bottom of feature A in the isolated region of the dielectric according to an embodiment of the present invention;

FIG. 11 is a cross-sectional diagram illustrating an etch back having been performed to open up the sacrificial spacer at the bottoms of features B in the semi-isolated region of the dielectric according to an embodiment of the present invention;

FIG. 12 is a cross-sectional diagram illustrating the sacrificial spacer pinching-off the features C in the dense region of the dielectric according to an embodiment of the present invention;

FIG. 16 is a cross-sectional diagram illustrating features A' having been patterned in the dielectric, and the features A/A' having been filled with a conductive material according to an embodiment of the present invention;

FIG. 17 is a cross-sectional diagram illustrating features B' having been patterned in the dielectric, and the features B/B' having been filled with the conductive material according to an embodiment of the present invention; and FIG. 18 is a cross-sectional diagram illustrating features C having been filled with the conductive material according to an embodiment of the present invention.

DETAILED DESCRIPTION OF PREFERRED EMBODIMENTS

Provided herein are techniques to improve critical dimension (CD) width and depth uniformity between features patterned with different layout densities. As will be described in detail below, the present techniques involve first partially etching features (such as vias, trenches, etc.) in a dielectric with different layout densities. As provided above, based on etch loading effects, iso-dense loading will result in the partially-etched features being of differing depths.

For example, in some instances, isolated features will etch slower (and hence be shallower) than dense features. When a sacrificial spacer material is deposited into the features, due to their shallower depth, the isolated features will receive less spacer than the dense features. A partial etch back of the sacrificial spacer can then open the isolated features (while the dense features remain plugged) to enable a selective etch of the isolated features to an even depth with the dense features. As will be described in detail below, after removal of the sacrificial spacer material, the features have a unique discontinuous tapered sidewall profile.

An exemplary methodology for forming a contact structure in accordance with the present techniques is now described by way of reference to FIGS. 1-18. In the present example, the contact structure is being formed in the back-end-of-line (BEOL) by way of a dual damascene process to pattern features (e.g., trenches, vias, etc.) in a dielectric 106 to an underlying metal layer 102 (i.e., Mx). See FIG. 1.

Figure 1:
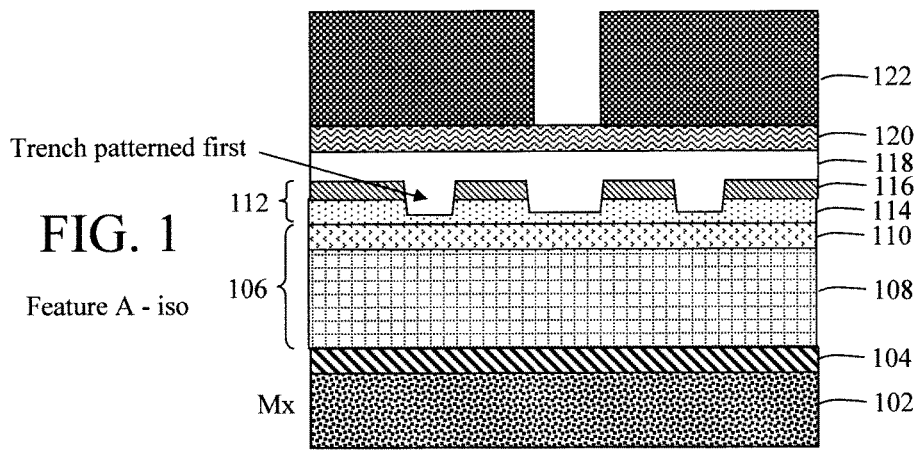
FIG. 1 is a cross-sectional diagram illustrating a dielectric in an isolated region separated from a metal layer by a capping layer, a hardmask having been formed on the dielectric, and a patterned photoresist over the hardmask according to an embodiment of the present invention.

As shown in FIG. 1, a capping layer 104 is disposed on the metal layer 102, separating the metal layer 102 from the dielectric 106. The capping layer 104 can include both metal and insulator layers, or only an insulator layer. The metal capping layer can include, but is not limited to, cobalt (Co), ruthenium (Ru), tantalum (Ta), and/or cobalt tungsten phosphorus (CoWP). Suitable insulator capping materials for the capping layer 104 include, but are not limited to, silicon nitride (SiN), silicon carbide (SiC), nitrogen doped silicon carbide (SiCNH), oxygen doped silicon carbide (ODC), nitrogen doped silicon carbide (NDC), aluminum nitride (AlN), and/or aluminum oxide (AlOx). Capping layer 104 can be deposited onto the metal layer 102 using a process such as chemical vapor deposition (CVD), atomic layer deposition (ALD) or physical vapor deposition (PVD). According to an exemplary embodiment, capping layer 104 has a thickness of from about 2 nanometers (nm) to about 20 nm and ranges therebetween.

According to an exemplary embodiment, the dielectric 106 includes a stack of layers. For instance, in the present example the dielectric 106 includes a first dielectric layer 108 disposed on the capping layer 104 and a second dielectric layer 110 disposed on the first dielectric layer 108. It is notable, however, that this example is being provided for the mere purpose of illustrating the present techniques, and a variety of other single/multi-layer dielectric configurations are contemplated herein.

In one exemplary embodiment, the first/second dielectric layers 108/110 are interlayer dielectrics (ILDs). For instance, in one exemplary embodiment, first dielectric layer 108 is an ultralow-κ interlayer dielectric (ULK-ILD), e.g., having a dielectric constant κ of less than 2.7. By comparison, silicon dioxide ($SiO_2$) has a dielectric constant κ value of 3.9. Suitable ultralow-κ dielectric materials include, but are not limited to, porous organosilicate glass (pSiCOH). First dielectric layer 108 can be deposited onto the capping layer 104 using a casting process such as spin coating, spray coating, etc. According to an exemplary embodiment, the first dielectric layer 108 has a thickness of from about 50 nm to about 150 nm and ranges therebetween.

In one exemplary embodiment, the second dielectric layer 110 is dielectric hardmask and includes, but is not limited to, silicon nitride and/or octamethylcyclotetrasiloxane (OMCTS). Second dielectric layer 110 can be deposited onto the first dielectric layer 108 using a casting process such as spin coating, spray coating, etc. According to an exemplary embodiment, the second dielectric layer 110 has a thickness of from about 5 nm to about 20 nm and ranges therebetween.

In order to pattern the features in the dielectric 106, a hardmask 112 is next formed on the dielectric 106. According to an exemplary embodiment, the hardmask 112 includes a stack of layers. For instance, in the present example the hardmask 112 includes a first hardmask layer 114 disposed on the second dielectric layer 110 and a second hardmask layer 116 disposed on the first hardmask layer 114. It is notable, however, that this example is being provided for the mere purpose of illustrating the present techniques, and a variety of other single/multi-layer hardmask configurations are contemplated herein. Each of the layers of hardmask 112 can be deposited onto the dielectric 106 using a process such as CVD, ALD or PVD.

In one exemplary embodiment, the first hardmask layer 114 is formed from tetraethyl orthosilicate (TEOS). TEOS is a precursor to silicon oxide (SiOx), and serves to protect against damage to the underlying dielectric 106. Alternatively, first hardmask layer 114 can be formed from an oxide such as SiOx. According to an exemplary embodiment, the first hardmask layer 114 has a thickness of from about 5 nm to about 20 nm and ranges therebetween. In one exemplary embodiment, the second hardmask layer 116 is formed from a nitride material such as titanium nitride (TiN). According to an exemplary embodiment, the second hardmask layer 116 has a thickness of from about 5 nm to about 20 nm and ranges therebetween.

The hardmask 112, once patterned, will be used as a mask to etch features (in this example vias) in the dielectric 106. By way of example only, photolithography techniques can be used to pattern a photoresist 122. The pattern from the photoresist 122 can then be etched into the hardmask 112. Prior to depositing the photoresist 122, a developable organic planarizing layer (OPL) 118 is deposited onto the hardmask 112, and a developable antireflective coating (ARC) 120 is deposited onto the OPL 118. Photoresist 122 is deposited onto the ARC 120. Each of OPL 118/ARC 120/photoresist 122 can be deposited onto the hardmask 112 using a process such as spin coating (CVD, ALD or PVD). According to an exemplary embodiment, OPL 118 and ARC 120 each have a thickness of from about 10 nm to about 50 nm and ranges therebetween, and photoresist 122 has a thickness of from about 30 nm to about 50 nm and ranges therebetween.

According to an exemplary embodiment, a dual damascene process is employed. Generally, a dual damascene process involves patterning vias and trenches (in a dielectric) and then filling the vias/trenches with a conductor. The vias and trenches can be patterned in any order. For instance, when the vias are patterned before the trenches, this is referred to herein as a "via-first" process. Conversely, when the trenches are patterned before the vias, this is referred to herein as a "trench-first" process.

Figure 2:
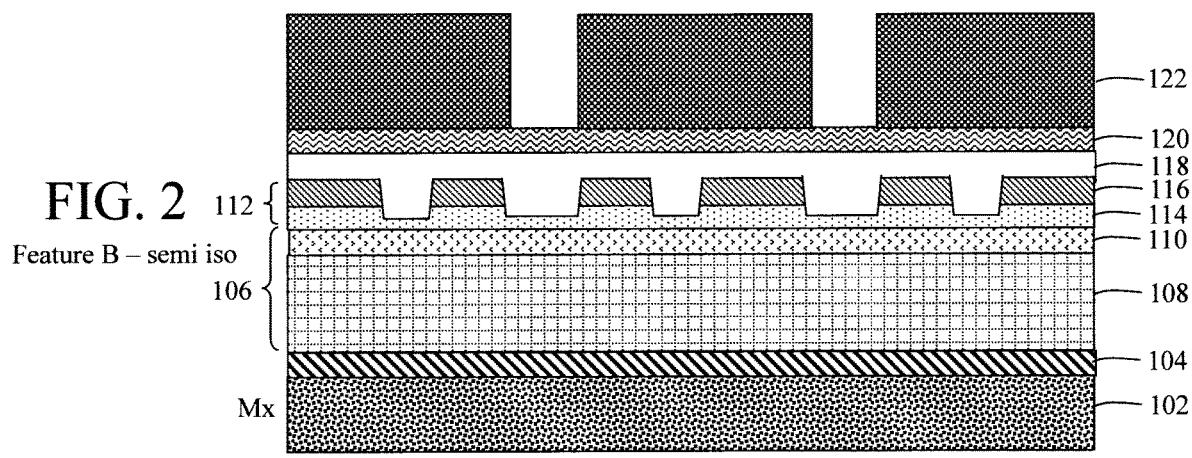
FIG. 2 is a cross-sectional diagram illustrating the dielectric in a semi-isolated region separated from the metal layer by a capping layer, the hardmask having been formed on the dielectric, and the patterned photoresist over the hardmask according to an embodiment of the present invention.
Figure 3:
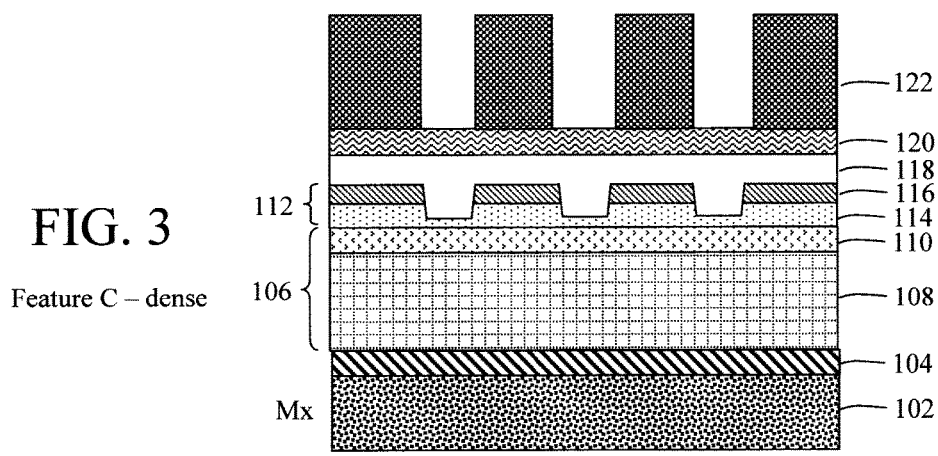
FIG. 3 is a cross-sectional diagram illustrating the dielectric in a dense region separated from the metal layer by a capping layer, the hardmask having been formed on the dielectric, and the patterned photoresist over the hardmask according to an embodiment of the present invention.

For illustrative purposes only, the present example involves the patterning of features (A, B, C) at three different layout densities isolated (iso), semi-iso and dense, respectively. For instance, FIG. 1 depicts the patterning of a single (isolated) feature A, FIG. 2 depicts the patterning of multiple semi-isolated features B, and FIG. 3 depicts the patterning of dense features C. The notion here is that the layout density of feature A is less than that of feature B which is less than that of feature C, i.e., A<B<C. Further, while multiple figures are used to illustrate each step of the present process, this is done to depict different regions of the same wafer, i.e., the features (A, B, C, etc.) are patterned in different (iso, semi-iso and dense) regions of the same dielectric 106. Thus, for example, FIGS. 1-3 depict different (iso, semi-iso and dense) regions of the same starting structure having the dielectric 106 over the metal layer 102/capping layer 104, hardmask 112 over the dielectric 106, etc.

The pattern from the photoresist 122 is etched into the hardmask 112, and the etched/patterned hardmask 112 is then used to pattern features A, B and C in iso, semi-iso and dense regions of the dielectric 106. See FIGS. 4-6, respectively. According to an exemplary embodiment, features A, B and C are vias patterned in the dielectric 106 using a directional (anisotropic) etching process such as reactive ion etching (RIE).

Due to etch loading effects, features A, B and C will etch to different depths in the iso, semi-iso and dense regions of the dielectric 106, respectively. See, for example, FIGS. 4-6 where features A, B and C are etched to depths $D_A$, $D_B$ and $D_C$, respectively, where $D_A<D_B<D_C$. As a result, one or more of the features will be partially etched at this stage in the process. By "partially etched" it is meant that the feature (e.g., via) extends only partway through the dielectric 106. For instance, referring to FIG. 4, feature A extends only partway through the dielectric 106. The same is true for feature B. See FIG. 5. However, with an increased layout density, the semi-iso features B extend a greater depth into the dielectric 106. Compare FIG. 4 and FIG. 5. This is due to the etch loading effects where the etch rate is faster for semi-isolated features than for isolated features, and vice versa. With dense features, the etch rate is further increased, resulting in the features C extending completely through the dielectric 106, down to the capping layer 104.

Figure 4:
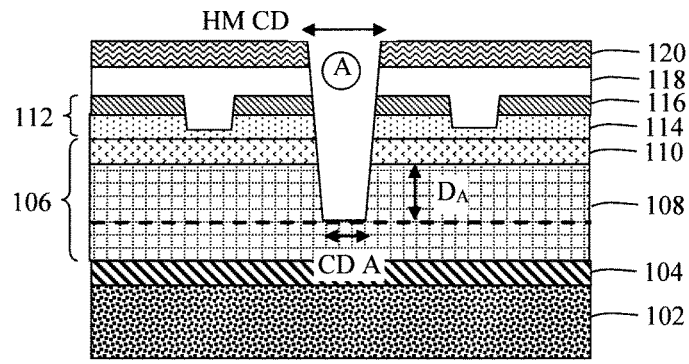
FIG. 4 is a cross-sectional diagram illustrating the pattern from the photoresist having been etched into the hardmask, and the etched/patterned hardmask having been used to pattern a feature A in the isolated region of the dielectric according to an embodiment of the present invention.
Figure 5:
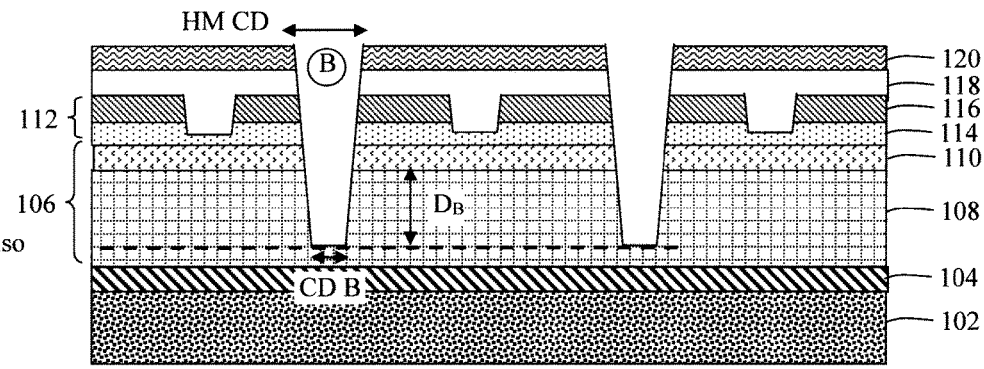
FIG. 5 is a cross-sectional diagram illustrating the pattern from the photoresist having been etched into the hardmask, and the etched/patterned hardmask having been used to pattern features B in the semi-isolated region of the dielectric according to an embodiment of the present invention.
Figure 6:
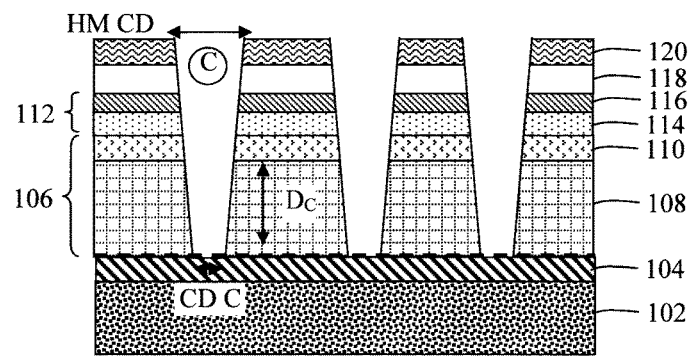
FIG. 6 is a cross-sectional diagram illustrating the pattern from the photoresist having been etched into the hardmask, and the etched/patterned hardmask having been used to pattern features C in the dense region of the dielectric according to an embodiment of the present invention.

As shown in FIGS. 4-6, the features A, B, C, (e.g., vias) each have a tapered profile. Notably, starting with the same critical dimension (CD) in the hardmask 112 (HM CD), the CD at the bottom of the features A, B, C is different. Namely, CD A of feature A (FIG. 4) is greater than CD B of feature B (FIG. 5), and CD B of feature B is greater than CD C of feature C (FIG. 6), i.e., CD A>CD B>CD C. This variation in CD at the bottom of the features will be leveraged, via a sacrificial spacer, to pinch off the smaller/deeper features (such as features C), thereby enabling completion of the etch for the larger/shallower features (such as features A and/or B).

Figure 7:
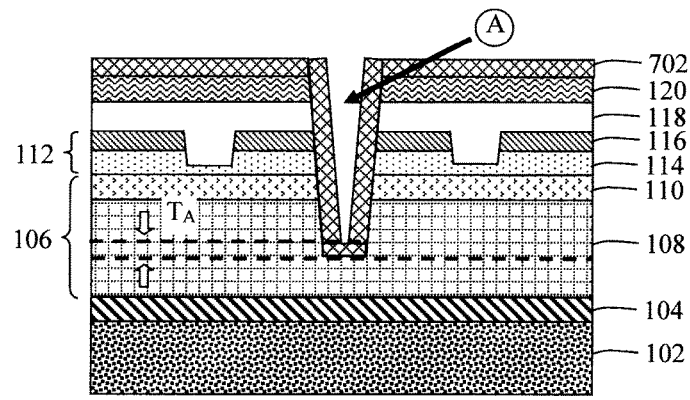
FIG. 7 is a cross-sectional diagram illustrating a conformal sacrificial spacer having been deposited into and lining the feature A in the isolated region of the dielectric according to an embodiment of the present invention.
Figure 8:
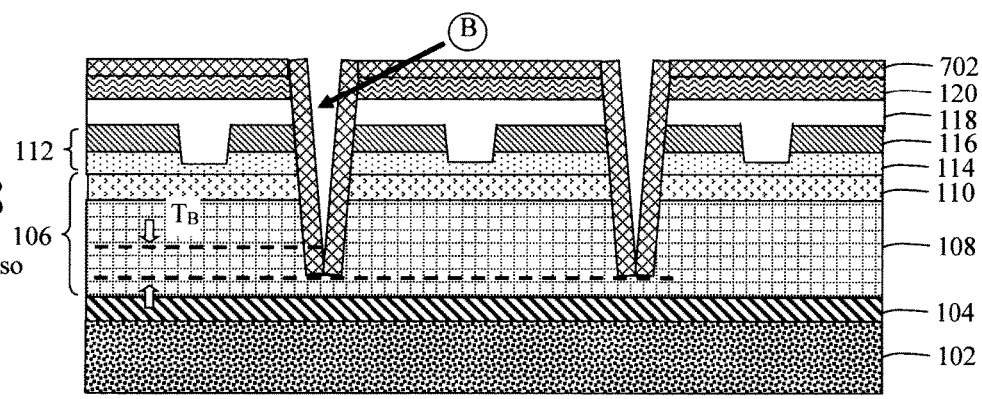
FIG. 8 is a cross-sectional diagram illustrating a conformal sacrificial spacer having been deposited into and lining the features B in the semi-isolated region of the dielectric according to an embodiment of the present invention.
Figure 9:
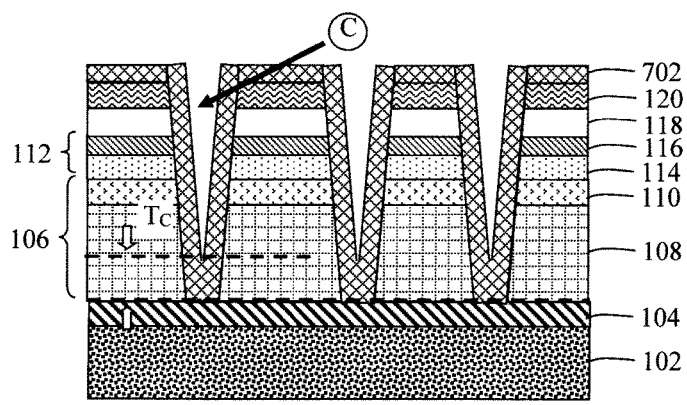
FIG. 9 is a cross-sectional diagram illustrating a conformal sacrificial spacer having been deposited into and lining the features C in the dense region of the dielectric according to an embodiment of the present invention.
Figure 13:
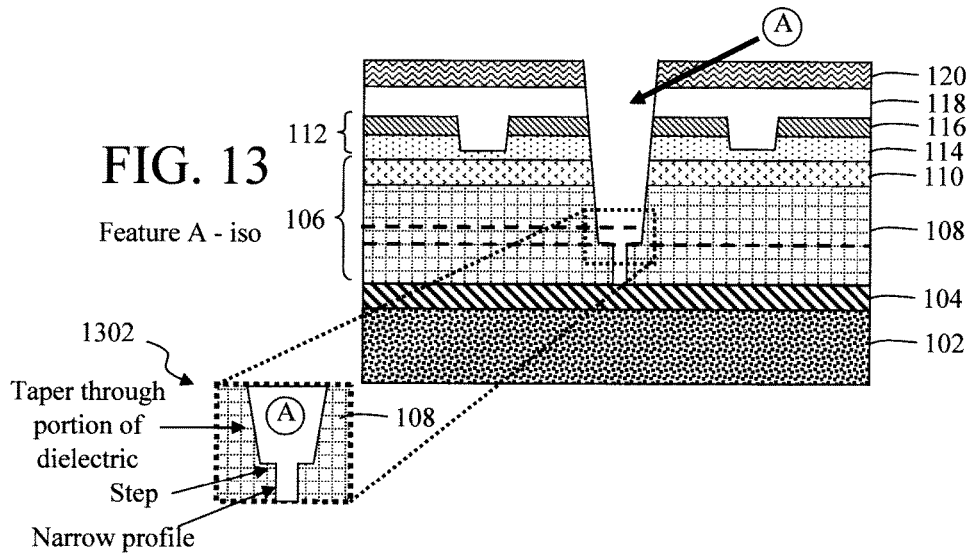
FIG. 13 is a cross-sectional diagram illustrating the remaining sacrificial spacer having been removed from the feature A in the isolated region of the dielectric revealing a discontinuous taper with a stepped sidewall profile according to an embodiment of the present invention.

Namely, as shown in FIGS. 7-9, a conformal sacrificial spacer 702 is next deposited into and lining the features A, B and C, respectively. The term "sacrificial" means that the spacer 702 is used in an intermediate step to pinch off the smaller/deeper features (such as features C) while the larger/shallower features (such as features A and/or B) are extended, and then is removed. Thus, the sacrificial spacer 702 has to meet certain requirements. First, the sacrificial spacer 702 has to withstand the (e.g., RIE) that will be used to extend the larger/shallower features. Second, the sacrificial spacer 702 has to be removable with respect the rest of the stack. Suitable sacrificial spacer materials that meet those requirements include, but are not limited to, silicon nitride (SiN), titanium oxide (TiOx) and/or amorphous silicon (aSi). According to an exemplary embodiment, the sacrificial spacer 702 is deposited into/lining the features A, B, and C (e.g., using a process such as CVD, ALD or PVD) to a thickness of from about 2 nm to about 10 nm and ranges therebetween.

As shown in FIG. 7, the sacrificial spacer 702 has a thickness $T_A$ at the bottom of the feature A (equivalent to the deposited thickness of the sacrificial spacer 702). This is the result of the feature A having the largest CD, i.e., CD A (see above). By comparison, as shown in FIG. 8, the sacrificial spacer 702 has a thickness $T_B$ at the bottom of the features B, wherein $T_B>T_A$. This is the result of the features B having a smaller CD B than CD A, i.e., CD B<CD A, whereby the sacrificial spacer 702 along the sidewalls of the features B begin to merge at the bottoms of the features B. As shown in FIG. 9, the sacrificial spacer 702 has a thickness $T_C$ at the bottom of the features C, wherein $T_C>T_B>T_A$. This is the result of the features C having a smaller CD C than both CD A and CD B, i.e., CD C<CD B<CD A, whereby the sacrificial spacer 702 along the sidewalls of the features C fully merges at the bottoms of the features C and fills in/pinches off the bottoms of the features C.

An etch back is next performed to open up the sacrificial spacer 702 at the bottoms of the larger/shallower features (such as features A and/or B), followed by an etch to selectively extend these larger/shallower features into the dielectric 106. See FIGS. 10-12. Notably, the sacrificial spacer 702 at the bottoms of the smaller/deeper features (such as features C) is thicker and is not fully removed by the etch back. Thus, the sacrificial spacer 702 blocks further extension of these smaller/deeper features.

According to an exemplary embodiment, the etch back of the sacrificial spacer 702 is performed using a directional (anisotropic) etching process such as RIE. The goal is to remove the sacrificial spacer 702 from the bottom(s) of the larger/shallower features (such as features A and/or B). An anisotropic etching process like RIE (with a selective etch chemistry for the sacrificial spacer material—see above) will remove the sacrificial spacer 702 from horizontal surfaces including the top of ARC 120 and the bottoms of the larger/shallower features. See FIGS. 10-12. However, the sacrificial spacer 702 at the bottoms of the smaller/deeper features (such as features C) is thicker (e.g., $T_C>T_B>T_A$) and is not fully removed by the etch back. Thus, the smaller/deeper features remain pinched-off by the sacrificial spacer 702. See FIG. 12.

As shown in FIGS. 10 and 11, the larger/shallower features (such as features A and/or B) are not pinched-off by the sacrificial spacer 702 and, following the etch back, these features are extended in the dielectric 106 down to the capping layer 104. As above, a directional (anisotropic) etching process such as RIE can be used to pattern/extend the features in the dielectric 106.

The remaining sacrificial spacer 702 is then removed from the features A, B, C, etc. See FIGS. 13-15. A non-directional (isotropic) etching process such as a wet chemical etch can be used to remove the sacrificial spacer 702. Removal of the sacrificial spacer 702 reveals a uniquely shaped feature. Specifically, referring to FIG. 13 the feature A has a discontinuous taper along its sidewalls. This is due to the two-step etching process used to pattern and then extend the feature A in the dielectric 106. Namely, as provided in detail above, the feature A was first partially etched in the dielectric 106. The sacrificial spacer 702 was then deposited into/lining the feature A and etched back. The sacrificial spacer 702 and spacer etch back created a smaller opening at the bottom of the feature A (i.e., following etch back, the sacrificial spacer 702 remained along the sidewalls of the feature A). As a result, feature A has a stepped sidewall profile with a continuous taper through a portion of the dielectric 106, followed by a step, and then a narrower profile through the balance of dielectric 106. See magnified view 1302.

Figure 14:
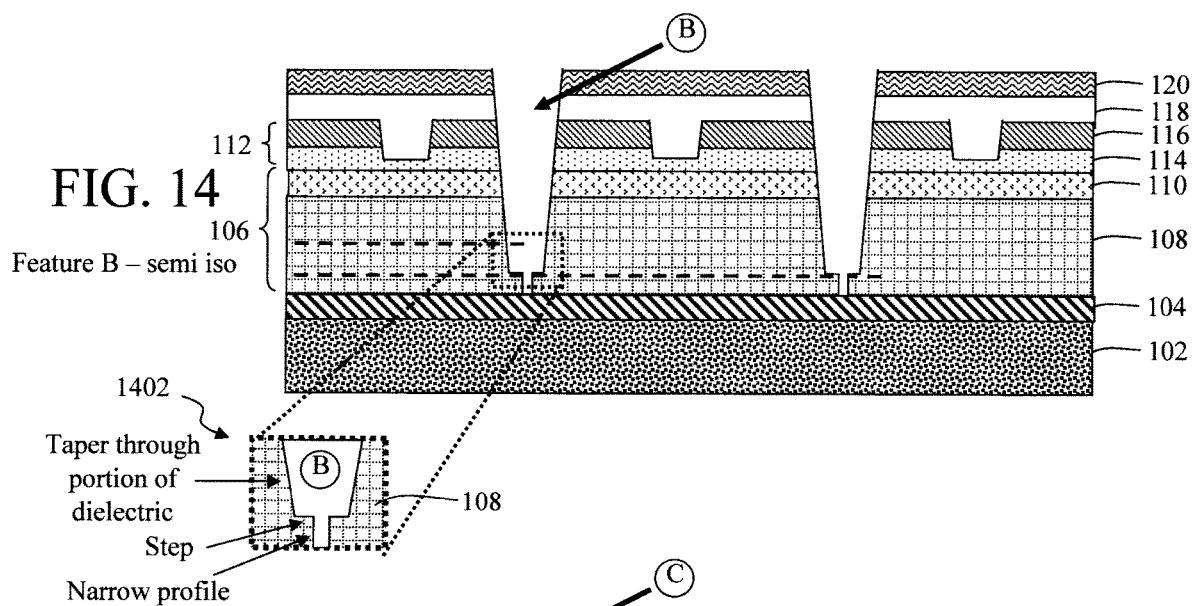
FIG. 14 is a cross-sectional diagram illustrating the remaining sacrificial spacer having been removed from the features B in the semi-isolated region of the dielectric revealing a discontinuous taper with a stepped sidewall profile according to an embodiment of the present invention.

Similarly, referring to FIG. 14, features B have a discontinuous taper along their sidewalls. This is due to the two-step etching process used to pattern and then extend the features B in the dielectric 106. Namely, as provided in detail above, the features B were first partially etched in the dielectric 106. The sacrificial spacer 702 was then deposited into/lining the features A and etched back. The sacrificial spacer 702 and spacer etch back created a smaller opening at the bottoms of the features B (i.e., following etch back, the sacrificial spacer 702 remained along the sidewalls of the features B). As a result, features B have a stepped sidewall profile with a continuous taper through a portion of the dielectric 106, followed by a step (which is smaller than that depicted in FIG. 13), and then a narrower profile through the balance of dielectric 106. See magnified view 1402.

Figure 15:
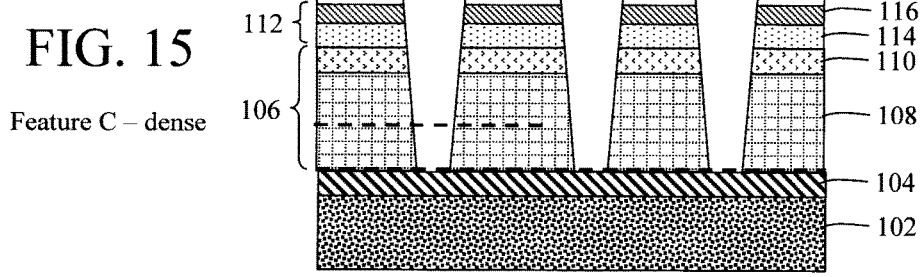
FIG. 15 is a cross-sectional diagram illustrating the remaining sacrificial spacer having been removed from the features C in the dense region of the dielectric revealing a continuous taper according to an embodiment of the present invention.

By contrast, as shown in FIG. 15, the features C do not have a stepped profile since these features were patterned in the dielectric 106 using a single etch step and, due to the presence of the sacrificial spacer 702 pinching-off features C, were not extended. Thus, the features C in this example have a continuous taper along their sidewalls.

Finally, the OPL 118 and ARC 120 are removed and the hardmask 112 is used to pattern features A', B', etc. (e.g., trenches) in the dielectric 106. The features A, B, C, etc. and A', B', etc. are then filled with a conductive material 1602 to complete the contact structure. See FIGS. 16-18. Suitable conductive materials include, but are not limited to, contact metals such as copper (Cu), cobalt (Co), ruthenium (Ru), tungsten (W), nickel (Ni), and/or gold (Au).

Specifically, as shown in FIG. 16, features A' (e.g., trenches) are patterned in the dielectric 106 adjacent to the feature A (e.g., via). The features A and A' are then filled with the conductive material 1602 forming, e.g., contacts and lines, respectively in the iso region of dielectric 106. Similarly, as shown in FIG. 17, features B' (e.g., trenches) are patterned in the dielectric 106 adjacent to the features B (e.g., vias). The features B and B' are then filled with the conductive material 1602 forming, e.g., contacts and lines, respectively in the semi-iso region of the dielectric 106. As shown in FIG. 18, the features C are filled with the conductive material 1602 forming, e.g., contacts, in the dense region of the dielectric 106.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming a contact structure, the method comprising the steps of:
    patterning features in at least two different regions of a dielectric at different layout densities whereby, due to etch loading effects, the features are patterned to different depths in the dielectric and have different bottom dimensions;
    depositing a sacrificial spacer into and lining the features whereby, due to the features having the different bottom dimensions, some of the features are pinched-off by the sacrificial spacer;
    opening up the sacrificial spacer at bottoms of one or more the features that are not pinched-off by the sacrificial spacer;
    selectively extending the one or more features in the dielectric, such that the one or more features have a discontinuous taper with a stepped sidewall profile;
    removing the sacrificial spacer; and
    filling the features with a conductive material to form the contact structure.

2. The method of claim 1, wherein the features are selected from the group consisting of: vias, trenches, and combinations thereof.

3. The method of claim 1, wherein the sacrificial spacer comprises a material selected from the group consisting of: silicon nitride (SiN), titanium oxide (TiOx), amorphous silicon (aSi), and combinations thereof.

4. The method of claim 1, wherein the sacrificial spacer is deposited to a thickness of from about 2 nm to about 10 nm and ranges therebetween.

5. The method of claim 1, wherein the dielectric is present over a metal layer (Mx).

6. The method of claim 5, wherein a capping layer separates the metal layer from the dielectric.

7. The method of claim 1, further comprising the steps of:
    patterning a feature A in an isolated region of the dielectric, features B in a semi-isolated region of the dielectric, and features C in a dense region of the dielectric, wherein a layout density of feature A is less than a layout density of features B, and wherein a layout density of features B is less than a layout density of features C.

8. The method of claim 7, wherein the feature A is patterned to a depth $D_A$ in the dielectric, the features B are patterned to a depth $D_B$ in the dielectric, and the features C are patterned to a depth $D_C$ in the dielectric, and wherein $D_A < D_B < D_C$.

9. The method of claim 7, wherein the feature A has a bottom critical dimension (CD) CD A, the features B have a bottom critical dimension CD B, and the features C have a bottom critical dimension CD C, and wherein CD A>CD B>CD C.

10. The method of claim 7, wherein the sacrificial spacer has a thickness $T_A$ at a bottom of the feature A, the sacrificial spacer has a thickness $T_B$ at bottoms of the features B, and the sacrificial spacer has a thickness $T_C$ at bottoms of the features C, and wherein $T_C > T_B > T_A$.

11. The method of claim 7, wherein the features A and B are not pinched-off by the sacrificial spacer, and wherein the features C are pinched off by the sacrificial spacer.

12. The method of claim 7, wherein the features A and B are selectively extended in the dielectric.

13. The method of claim 7, wherein the features A and B have the discontinuous taper with the stepped sidewall profile.

14. The method of claim 7, wherein the features C have a continuous taper.

15. The method of claim 1, wherein the conductive material comprises a contact metal selected from the group consisting of: nickel (Ni), platinum (Pt), copper (Cu), gold (Au), and combinations thereof.

* * * * *